(12) United States Patent
Park et al.

(10) Patent No.: US 9,525,200 B2
(45) Date of Patent: Dec. 20, 2016

(54) MULTI-LAYER SUBSTRATE AND METHOD OF MANUFACTURING MULTI-LAYER SUBSTRATE

(71) Applicant: MANDO CORPORATION, Pyeongtaek-si, Gyeonggi-do (KR)

(72) Inventors: Jong Gyu Park, Yongin-si (KR); Han Yeol Yu, Suwon-si (KR)

(73) Assignee: MANDO CORPORATION, Pyeongtaek-si (KR)

( * ) Notice: Subject to any disclaimer, the term of this patent is extended or adjusted under 35 U.S.C. 154(b) by 0 days.

(21) Appl. No.: 14/699,465

(22) Filed: Apr. 29, 2015

(65) Prior Publication Data
US 2015/0318597 A1    Nov. 5, 2015

(30) Foreign Application Priority Data

Apr. 30, 2014 (KR) ........................ 10-2014-0052304

(51) Int. Cl.
| | |
|---|---|
| *H03H 5/00* | (2006.01) |
| *H01P 11/00* | (2006.01) |
| *H01P 3/12* | (2006.01) |
| *H01P 3/08* | (2006.01) |
| *H01Q 1/38* | (2006.01) |
| *H01P 5/02* | (2006.01) |
| *H05K 1/02* | (2006.01) |
| *H05K 1/14* | (2006.01) |
| *H01P 5/107* | (2006.01) |

(52) U.S. Cl.
CPC ................. *H01P 3/121* (2013.01); *H01P 3/08* (2013.01); *H01P 5/028* (2013.01); *H01P 11/002* (2013.01); *H01P 11/003* (2013.01); *H01Q 1/38* (2013.01); *H05K 1/0242* (2013.01); *H05K 1/144* (2013.01); *H05K 2201/037* (2013.01); *H05K 2201/042* (2013.01); *H05K 2203/041* (2013.01); *Y10T 29/49018* (2015.01)

(58) Field of Classification Search
CPC ................................. H01P 3/121; H01P 3/08
USPC ..................................................... 333/26, 254
See application file for complete search history.

(56) References Cited

U.S. PATENT DOCUMENTS

| | | | | |
|---|---|---|---|---|
| 6,400,241 | B1 * | 6/2002 | Ulian ...................... | H01P 1/047 333/246 |
| 6,903,700 | B2 * | 6/2005 | Maruhashi .............. | H01P 5/185 333/125 |
| 6,937,120 | B2 * | 8/2005 | Fisher .................... | H01P 1/047 174/266 |
| 7,084,723 | B2 * | 8/2006 | Tamaki ................... | H01P 1/042 333/254 |

(Continued)

*Primary Examiner* — Dean Takaoka
(74) *Attorney, Agent, or Firm* — Hauptman Ham, LLP

(57) ABSTRACT

The present invention relates to a multi-layer substrate which can be used in a wireless signal transmission/reception apparatus, etc, a through-hole and a first waveguide and a second waveguide which are formed by conductive films enclosing the inner surface of the through-hole are formed on an upper substrate and a lower substrate of the multi-layer substrate, respectively, and an RF signal can be transmitted between an upper surface and a lower surface through the two waveguides. A process of manufacturing a multi-layer substrate by a Surface Mount Technology (SMT) is used, so that a waveguide passing through the multi-layer substrate can be precisely and easily formed.

4 Claims, 19 Drawing Sheets

(56) References Cited

U.S. PATENT DOCUMENTS

2011/0140810 A1\* 6/2011 Leiba ..................... H01P 3/121
333/239

\* cited by examiner

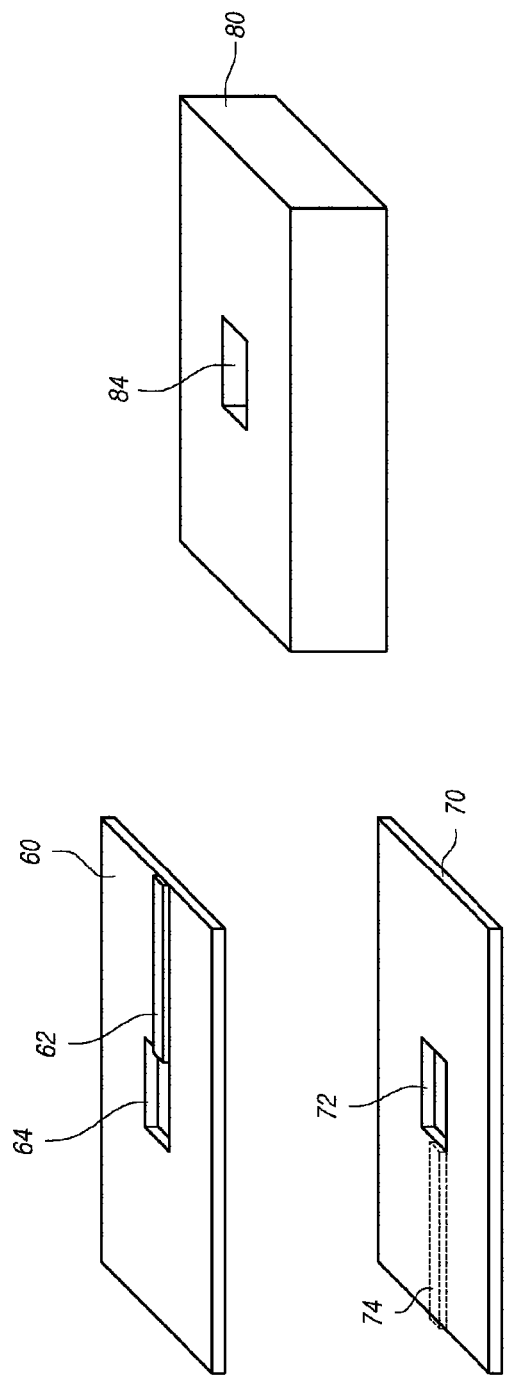

MULTI-LAYER SUBSTRATE AND METHOD OF MANUFACTURING MULTI-LAYER SUBSTRATE

CROSS-REFERENCE TO RELATED APPLICATION

This application claims priority from and the benefit under 35 U.S.C. §119(a) of Korean Patent Application No. 10-2014-0052304, filed on Apr. 30, 2014, which is hereby incorporated by reference for all purposes as if fully set forth herein.

BACKGROUND OF THE INVENTION

1. Field of the Invention

The present invention relates to a multi-layer substrate including a waveguide for transmitting a radio frequency signal and a method of manufacturing the multi-layer substrate.

2. Description of the Prior Art

A wireless communication technology, in which a Radio Frequency (RF) signal such as a millimeter wave is used, is employed for data communication, an automobile radar, etc.

The RF signal, which is used in wireless communication, should be ensured to have a good transmission property in a Printed Circuit Board (PCB), etc.

Meanwhile, the automobile radar may include an RF signal processing unit for processing an RF signal using an antenna for transmitting/receiving an RF signal having a high frequency and converting the RF signal into an Intermediate Frequency (IF) signal or a baseband signal; and a baseband signal processing unit for processing the IF signal or the baseband signal. These circuit components can be configured by one or more chips and can be mounted on the PCB, etc.

At this time, a predetermined feed structure may be used to transmit the RF signal having a high frequency to the RF signal processing unit, and an example of the feed structure is a micro-strip line or a waveguide.

That is, when a circuit, in which an RF is used, is designed, techniques such as an RF micro-strip line, a waveguide, etc. may be used in order to reduce loss of a moving path of an RF signal.

In particular, when both an antenna pattern and an RF processing circuit (RF circuit) are arranged on one surface of the PCB, a metal pattern such as a micro-strip may be configured to transfer a signal between the antenna pattern and the RF circuit.

However, when the antenna pattern and the RF circuit are arranged on different surfaces of the PCB, a signal transmission structure, which passes through a substrate, should be formed to transmit an RF signal between the antenna pattern and the RF circuit. A structure of the waveguide may be used to transmit such an RF signal, and a waveguide, which is formed on a multi-layer wiring board, may be called a laminated waveguide.

When the micro-strip or the laminated waveguide is formed to have a high area density, the transmission path of an RF signal may be changed from the plane direction to the thickness direction of a substrate.

That is, an RF signal, which has moved in the plane direction of a substrate, may move in a direction vertical to the substrate along the laminated waveguide formed in the thickness direction of the substrate through the micro-strip pattern formed on the surface of the substrate.

In this way, when the transmission path of an RF signal is changed to the thickness direction of the substrate by the laminated waveguide, the RF signal is reflected at a portion where the direction is changed, so that a transmission loss is increased, and thus, the signal transmission property of the laminated waveguide may deteriorate.

In particular, as the RF signal has a frequency of tens of GHz, an effort to reduce the transmission loss caused by the transmission of the RF signal through the waveguide is required. To this end, the structure of the waveguide should be precisely formed.

That is, the waveguide in the substrate, which is used as a transmission structure of the RF signal corresponding to tens of GHz, should be manufactured with excellent precision in an assembling or forming process, and a performance difference resulting from an assembling tolerance or a forming tolerance greatly influences a performance of a radar, etc.

In particular, since a plurality of circuit elements should be mounted in signal transmission/reception apparatuses such as a recent automobile radar, etc., the substrate has a multi-layer structure having two or more layers, and thus, when a waveguide is formed in the multi-layer substrate, an assembling tolerance or a forming tolerance of the waveguide becomes important.

SUMMARY OF THE INVENTION

An aspect of the present invention is to provide a multi-layer substrate having a waveguide for transmitting an RF signal, and a method of manufacturing the same.

Another aspect of the present invention is to provide a method of manufacturing a multi-layer substrate including a waveguide which is precisely formed.

Another aspect of the present invention is to provide a multi-layer substrate including a waveguide having excellent RF transmission property resulting from a precise process, and a method of manufacturing the same.

Another aspect of the present invention is to couple a multi-layer substrate which includes a through-hole and a waveguide formed on the inner surface thereof by a conductive film and has one or more layers, using a soldering member, thereby ensuring a precise processing property and a signal transmission property of the waveguide.

In accordance with an aspect of the present invention, a multi-layer substrate is provided. The multi-layer substrate includes: an upper substrate including a first substrate base, a first signal line formed on the first substrate base, and a first waveguide which is connected to the first signal line and includes a first conductive film formed on an inner surface of a first through-hole passing through the first substrate base in a thickness direction; a lower substrate including a second base substrate, a second signal line formed on the second substrate base, and a second waveguide which is connected to the second signal line and includes a second conductive film formed on an inner surface of a second through-hole passing through the second substrate base in a thickness direction; and a coupling layer for coupling the upper substrate and the lower substrate to each other, wherein a Radio Frequency (RF) signal is transmitted between the upper substrate and the lower substrate through the first waveguide and the second waveguide.

In accordance with another aspect of the present invention, a method of manufacturing a multi-layer substrate is provided. The method includes: forming an upper substrate including a first signal line and a first waveguide connected to the first signal line; forming a lower substrate including a second signal line and a second waveguide connected to the second signal line; and coupling the upper substrate and the lower substrate by interposing a soldering member made of a metal material between the upper substrate and the lower substrate in a state in which the first waveguide and the second waveguide are arranged.

According to an embodiment of the present invention, when a multi-layer substrate is used, a wireless signal transmission/reception apparatus can obtain stable signal transmission performance of the waveguide for transmitting an RF signal and a microwave.

Further, according to an embodiment of the present invention, two or more substrates having waveguides are coupled to each other through a soldering member, so that a waveguide, which passes through the substrate, in a wireless signal transmission/reception apparatus can be precisely and easily manufactured.

Further, in accordance with a multi-layer substrate and a method of manufacturing the same according to the present invention, a performance deviation resulting from an assembling tolerance of the waveguide can be reduced.

Further, in accordance with the present invention, when a multi-layer substrate having a waveguide is manufactured, since two or more PCBs or substrates constituting the multi-layer substrate should be connected to each other in accordance with an arrangement standard, the present invention can be applied even when the sizes or the shapes of the substrates are different from each other.

Further, when the multi-layer substrate according to the present invention is used, various signal as well as an RF signal can be transmitted using a waveguide formed in the thickness direction of a multi-layer substrate.

Further, in accordance with the present invention, when a multi-layer substrate having a waveguide is manufactured, a Surface Mount Technology (SMT) of manufacturing an electronic substrate using a soldering member is used, accuracy of a process of manufacturing a waveguide in a multi-layer substrate is improved, and accordingly, a stable signal transmission performance of the waveguide can be ensured.

BRIEF DESCRIPTION OF THE DRAWINGS

The above and other objects, features and advantages of the present invention will be more apparent from the following detailed description taken in conjunction with the accompanying drawings, in which:

FIG. 1B illustrates an example of a multi-layer substrate including a waveguide;

DETAILED DESCRIPTION OF THE EXEMPLARY EMBODIMENTS

Figure 1A:
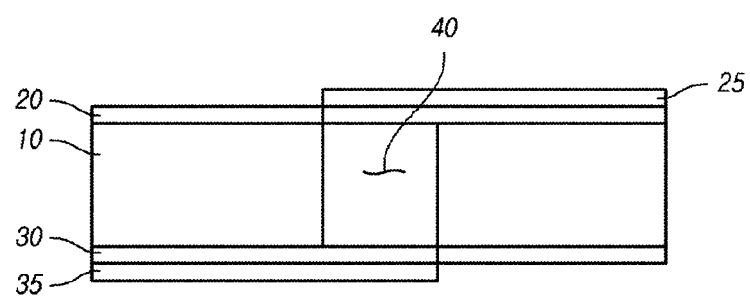
FIG. 1A illustrates a general substrate including a substrate penetration-type waveguide.

Hereinafter, embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1A is a side view and a perspective view illustrating a general substrate including upper/lower penetration-type waveguides.

A waveguide formed on a substrate illustrated in FIG. 1A includes a substrate base 10, an upper circuit pattern 20 which includes a first signal line and is formed on the substrate base 10, a lower circuit pattern 30 having a second signal line formed therein, and a waveguide 40 formed to pass through the substrate base 10.

The substrate base 10 has a form of a flat plate made of a substrate material such as a dielectric substance or an insulator, and may be made of a material of a general PCB.

The upper circuit pattern 20 and the lower circuit pattern 30 correspond to a metal thin-film pattern, which is formed on both surface of the substrate base 10. The upper circuit pattern 20 may include a first signal line 25, and the lower circuit pattern 30 may include a second signal line 35.

Further, an opening or a through-hole 40 having a predetermined size is formed in the substrate base 10, the upper circuit pattern 20, and the lower circuit pattern 30, and such a through-hole 40 functions as a waveguide passing through a substrate.

That is, an RF signal, which has been transmitted from the upper surface of the substrate along the first signal line, can be transmitted in the waveguide corresponding to the through-hole 40 formed to pass through the substrate in a direction vertical to the substrate and then can be transmitted to the lower surface of the substrate along the second signal line.

In summary, the substrate in FIG. 1A corresponds to a general PCB in which an opening is punched and is then used as a waveguide for transmitting an RF signal.

There is a disadvantage in that such a substrate in FIG. 1A has circuit patterns, i.e., the upper circuit pattern 20 and the lower circuit pattern 30, formed on both surfaces thereof which should have the same size, and there is a problem in that the substrate base has poor processability, and thus, when a soft material is used, it is difficult to form the opening and the through-hole.

FIG. 1B illustrates a general structure of a multi-layer substrate including a waveguide.

A multi-layer substrate in FIG. 1B includes an upper PCB 60, a lower PCB 70, and an intermediate plate 80 inserted between the both PCBs.

The upper PCB 60 and the lower PCB 70, which are general PCBs, have a structure in which a substrate base made of an insulator or a dielectric substance is formed at a center thereof and a metal pattern or a copper pattern is formed on both surfaces of the substrate base while having a form of a predetermined circuit.

Further, a first signal line 62 and an upper opening 64 are formed on the upper PCB 60 in FIG. 1B, and a second signal line 72 and a lower opening 74 are formed on the lower PCB 70.

The intermediate plate 80 is inserted between the two PCBs, and an intermediate opening 84, which communicates with the upper opening and the lower opening of the upper PCB and the lower PCB, is formed through one side of the intermediate plate 80.

Such an intermediate plate 80 may be a metal plate made of a metal material or may be a dielectric or insulating plate made of a material similar to that of the substrate base of the upper/lower substrates.

In order to manufacture the multi-layer substrate as in FIG. 1B, the upper PCB 60, in which the first signal line 62 and the upper opening 64 are formed, and the lower PCB 70, in which the second signal line 74 and the lower opening 74 are formed, are arranged, the intermediate plate is arranged therebetween, and the three layers are coupled to each other by bonding the layers using an adhesive.

Thus, when the multi-layer substrate is manufactured, a tolerance accords with a machine assembly tolerance, so that an assembling tolerance increases.

That is, when the upper opening 64, the intermediate opening 84, and the lower opening 74, which constitute the waveguide, are arranged well, the waveguide can be formed precisely, and accordingly, a signal transmission property of the waveguide becomes excellent.

However, in a case of the multi-layer substrate in FIG. 1B, when the upper/lower PCBs and the intermediate plate are assembled, an assembling tolerance, i.e., an arrangement tolerance of the waveguide, may be large, so that it is difficult to make the waveguide to have a precise structure.

Further, in the multi-layer substrate of FIG. 1B, only an RF signal, which can be transmitted through the waveguide, can be transmitted in the thickness direction of the multi-layer substrate, and a low frequency signal having a predetermined frequency or less cannot be transmitted in the thickness direction of the multi-layer substrate.

Therefore, in an embodiment of the present invention, an upper substrate including a first signal line and a first waveguide and a lower substrate including a second signal line and a second waveguide are arranged, and then the two substrates are coupled to each other by interposing a soldering member such as a soldering ball therebetween.

Conductive films having a predetermined thickness are formed inside the first waveguide and the second waveguide, and when the two substrates are coupled to each other, soldering is performed while the first waveguide and the second waveguide are arranged, so that the waveguide can be formed precisely.

That is, in an embodiment of the present invention, the upper substrate and the lower substrate, in which the first waveguide and the second waveguide are formed, are coupled to each other using the SMT including a soldering technique, so that a multi-layer substrate having a precise waveguide can be manufactured even without a separate intermediate plate.

Hereinafter, a detailed configuration of the multi-layer substrate according to an embodiment of the present invention will be described with reference to FIGS. 2 to 7.

Hereinafter, the multi-layer substrate according to an embodiment of the present invention may be used as a circuit board of a wireless signal transmission/reception apparatus such as an automobile radar, etc., but is not limited thereto, and corresponds to a concept including all types of multi-layer substrates which are formed by laminating two or more substrates and have a waveguide passing through a substrate in the thickness direction.

Figure 2A:
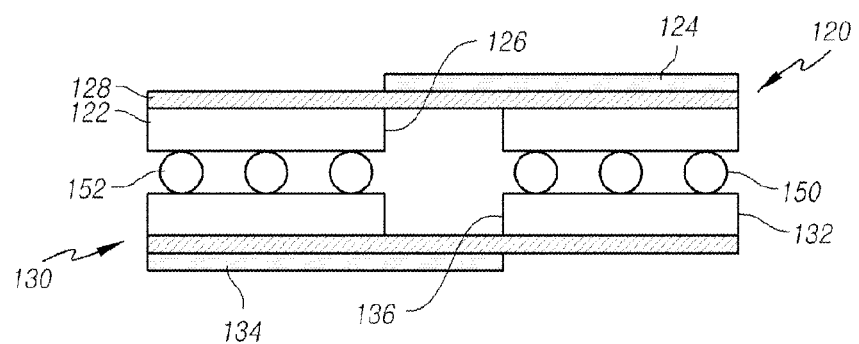
FIG. 2A is a side view illustrating a multi-layer substrate according to an embodiment of the present invention.
Figure 2B:
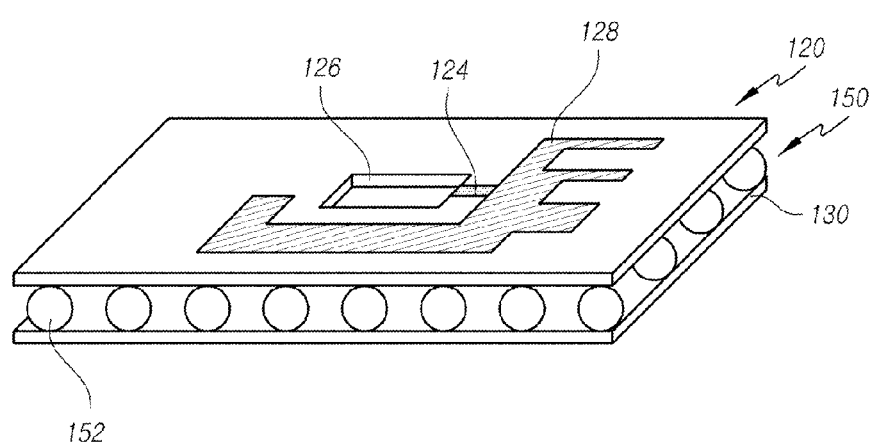
FIG. 2B is a perspective view illustrating the same.

FIG. 2A is a side view illustrating a multi-layer substrate according to an embodiment of the present invention, and FIG. 2B is a perspective view illustrating the same.

As illustrated in FIG. 2, a multi-layer substrate according to an embodiment of the present invention may include an upper substrate 120 in which a first signal line 124 is formed, a lower substrate 130 in which a second signal line 134 is formed, and a coupling layer 150 for coupling the upper substrate 120 and the lower substrate 130 to each other.

The upper substrate 120 may include a first substrate base 122, the first signal line 124 formed on the first substrate base 122, and a first through-hole 126 passing through the first substrate base 122 in the thickness direction. Further, an upper circuit pattern 128, which corresponds to a metal pattern, may be formed on the upper surface of the upper substrate 120.

Further, the lower substrate 130 may include a second substrate base 132, the second signal line 134 formed on the second substrate base 132, and a first through-hole 136 passing through the first substrate base 122 in the thickness direction. Further, a lower circuit pattern 138 may be formed on the lower surface of the lower substrate 130.

Further, as illustrated in FIG. 3 in detail, a first conductive film 220 and a second conductive film 230, which have a conductive property, may be formed on the inner surfaces of the first through-hole 126 of the upper substrate 120 and the second through-hole 136 of the lower substrate 130, respectively.

The first through-hole 126 in which the first conductive film 220 is formed constitutes an upper waveguide or a first waveguide to which an RF signal, having been transmitted through the first signal line 124, is transmitted, and the second through-hole 136 in which the second conductive film 230 is formed constitutes a lower waveguide or a second waveguide which transmits the RF signal, which has been transmitted to the first waveguide, to the lower substrate.

That is, the first waveguide and the second waveguide constitutes one waveguide, and an RF signal can be transmitted between the first signal line of the upper substrate and the second signal line of the lower substrate there through.

A detailed structure of the waveguide will be described in more detail with reference to FIG. 3.

Meanwhile, the coupling layer 150, in which a soldering member such as a soldering ball is disposed, is interposed between the upper substrate 120 and the lower substrate 130.

That is, one or more soldering balls 152 are arranged between the lower surface of the first substrate base 122 of the upper substrate 120 and the upper surface of the second substrate base 132 of the lower substrate 130, and the two substrates are coupled to each other by the soldering balls.

The soldering member, which is disposed on the coupling layer 150 and is used to couple the upper substrate 120 and the lower substrate 130 to each other, is a connection member made of a metal material, and may correspond to a spherical soldering ball or a soldering extension member lengthwise extending in the lengthwise direction.

Such a soldering member includes all adhesive members used for a soldering process, a welding process, etc. to couple two substrates to each other or attach a circuit element to a substrate.

Meanwhile, the upper circuit pattern 128, which is formed on the upper surface of the upper substrate 120 of the multi-layer substrate of FIG. 2, may be an antenna metal pattern such as a radar antenna, a path antenna, an array antenna, etc. At this time, the first signal line 122 may be a feed line extending from the antenna pattern.

Further, at this time, the lower circuit pattern 130, which is formed on the lower surface of the lower substrate 130, may be a circuit pattern for an RF signal processing circuit (RF processing circuit), etc., and the second signal line 132 may be a feed line for connecting the waveguide and the RF processing circuit to each other.

That is, the multi-layer substrate according to an embodiment of the present invention is manufactured by coupling the upper substrate and the lower substrate using the SMT, and circuit components may be mounted on both the upper surface of the upper substrate and the lower surface of the lower substrate.

Further, the first waveguide and the second waveguide, which are configured by through-holes and conductive films enclosing the inner surface of the through-holes, are formed on the upper substrate and the lower substrate of the multi-layer substrate, and an RF signal can be transmitted between the upper surface and the lower surface through the two waveguides.

Here, the upper substrate and/or the lower substrate may be all substrates which can be used as an electric circuit substrate, and a PCB may be employed as the substrates in order to achieve low manufacturing costs.

In an embodiment of FIG. 2, a surface opposite to a surface which belongs to the upper substrate and on which the first signal line 124 is disposed and a surface opposite to a surface which belongs to the lower substrate and on which the second signal line 134 is disposed become coupling surfaces of substrates.

The coupling surfaces of the two substrates are arranged to face each other, and thereafter, the two substrates are coupled by the coupling layer 150. Since circuit elements are generally arranged on the surfaces on which the first signal line 124 and the second signal line 134 are arranged, coupling of the surfaces opposite to the surfaces on which the circuit elements are arranged is easier.

Figure 3A:
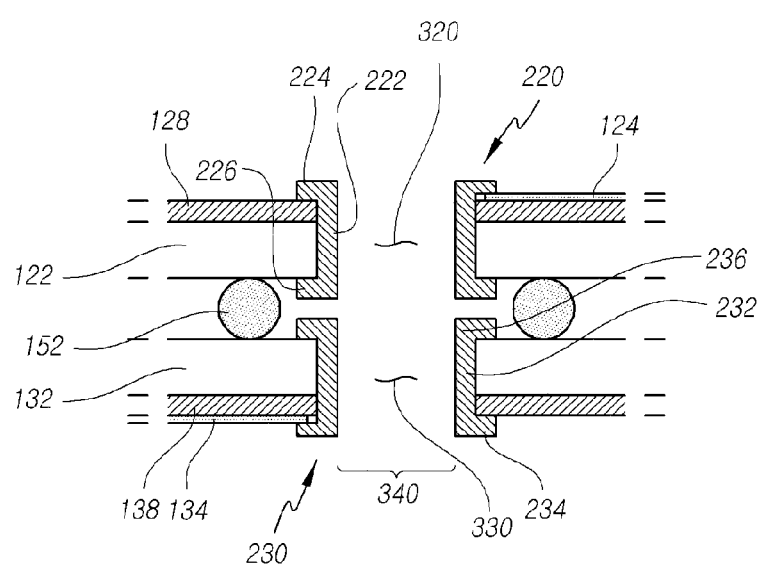
FIG. 3A is a side view illustrating a portion adjacent to a through-hole within the structure of FIG. 2A in detail.
Figure 3B:
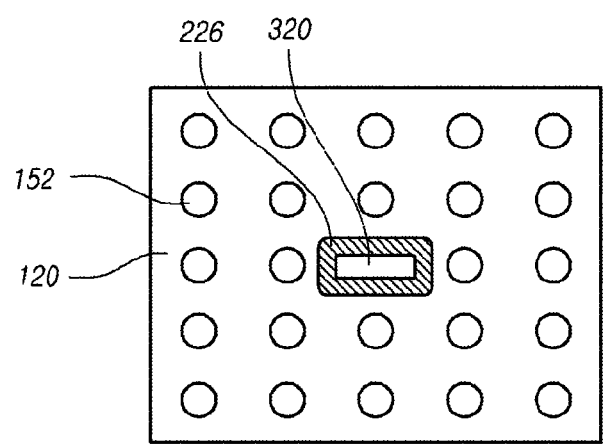
FIG. 3B is a plan view illustrating a coupling surface of an upper substrate of FIG. 2A.
Figure 3C:
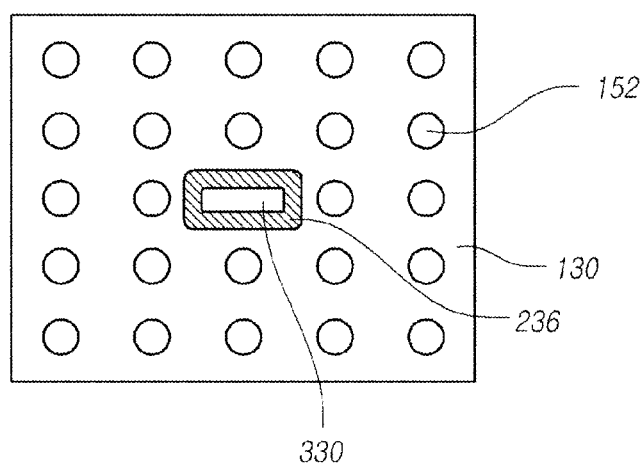
FIG. 3C is a plan view illustrating a coupling surface of a lower substrate of FIG. 2A.

FIG. 3A is a side sectional view illustrating a portion adjacent to a through-hole within the structure of FIG. 2A in detail, FIG. 3B is a plan view illustrating a coupling surface of an upper substrate of FIG. 2A, and FIG. 3C is a plan view illustrating a coupling surface of a lower substrate of FIG. 2A.

As illustrated, the upper substrate 120 includes the first substrate base 122, the upper circuit pattern 128 and the first signal line 124 are formed on the first substrate base 122, and the first through-hole 126, which vertically passes through the first substrate base 122, is formed.

Further, the first conductive film 220, which is made of a conductive material and is formed on the inner surface of the first through-hole 126, is formed, and a space, which is limited by the first conductive film 220, constitutes a first waveguide 320 through which an RF signal is transmitted.

FIG. 3 illustrates that the first signal line 124 is disposed on the upper circuit pattern 128 on the upper substrate 120. However, in some cases, the upper circuit pattern 128 and the first signal line 124 may be formed on the same layer and may be electrically connected to each other.

Meanwhile, the first conductive film 220, which is a conductive layer enclosing the inner surface of the first through-hole 126 of the upper substrate, may be made of a metal material such as copper, silver, etc.

Further, the first conductive film 220 may include a first side conductive layer 222 formed on the side surface of the first through-hole 126, a first upper flange conduction layer 224 which is connected to the first side surface conductive layer 222 and curvedly extends toward a part of the upper side of the first substrate base 122, and a first lower flange conductive layer 226 which is connected to the first side conductive layer and curvedly extends toward a part of the lower side of the first substrate base 122.

That is, the first conductive film 220, which constitutes the first waveguide 320 of the upper substrate 120, is entirely a U-shaped metal layer, and may extend from an edge of the first through-hole 126 toward parts of the upper surface and the lower surface of the upper substrate as well as toward a part of the side surface of the first through-hole 126 of the upper substrate.

Similarly to the upper substrate 120, the lower substrate 130 includes the second substrate base 132, the lower circuit pattern 138 and the second signal line 134 are formed on the lower surface of the first substrate base 132, and the second through-hole 136, which vertically passes through the second substrate base 132, is formed.

Further, the first conductive film 230, which is made of a conductive material and is formed on the inner surface of the second through-hole 136, is formed, and a space, which is limited by the first conductive film 230, constitutes a second waveguide 330 through which an RF signal is transmitted in the thickness direction of the lower substrate.

Similarly to the first conductive film 220, the second conductive film 230, which is a conductive layer enclosing the inner surface of the second through-hole of the lower substrate and is made of a metal material such as copper, silver, etc., may include a second side conductive layer 232 formed on the side surface of the second through-hole 136, a second upper flange conductive layer 234 which is connected to the second side surface conductive layer 232 and curvedly extends toward a part of the upper side of the second substrate base 132, and a second lower flange conductive layer 236 which is connected to the second side conductive layer and curvedly extends toward a part of the lower side of the second substrate base.

That is, the second conductive film 230, which constitutes the second waveguide 330 of the lower substrate 130, is entirely a U-shaped metal layer, and may extend from an edge of the second through-hole toward parts of the upper surface and the lower surface of the lower substrate 130 as well as toward a part of the side surface of the second through-hole 136 of the lower substrate 130.

It is preferred that the first conductive film 220 and the second conductive film 230, which enclose the inner surfaces of the through-holes of the upper substrate and the lower substrate, are electrically connected to the first signal line 124 and the second signal line 134.

In more detail, the first upper flange conduction layer 224 of the first conductive film 220 is formed to overlap one end of the first signal line 124 so as to be electrically connected to the first signal line 124, and this structure can be applied to a structure of the second conductive film and the second signal line.

The first waveguide 320 and the second waveguide 330 are arranged in a line so as to form an entire waveguide 340 which passes through the entirety of the multi-layer substrate, and an RF signal can be transmitted between the upper substrate and the lower substrate through the entire waveguide 340.

Meanwhile, the plurality of soldering balls 152, which form the coupling layer 150, can couple the coupling surfaces opposite to surfaces on which the circuit patterns 128 and 138 of the upper substrate and the lower substrate exist, and may have a shape of a circular or elliptical sphere as illustrated.

Since the first waveguide 320 and the second waveguide 330 are close to each other but do not directly contact each other, even when there is a certain arrangement tolerance, a performance of the waveguide does not greatly deteriorate.

In addition, an interval between the first waveguide 320 and the second waveguide 330 can be formed to be very small by adjusting the size of the soldering ball 152, and thus, signal loss resulting from the interval between the first waveguide and the second waveguide becomes very small.

FIGS. 4A to 4F illustrate a process of manufacturing a multi-layer substrate having a structure of FIGS. 2 and 3 according to an embodiment.

Figure 4A:
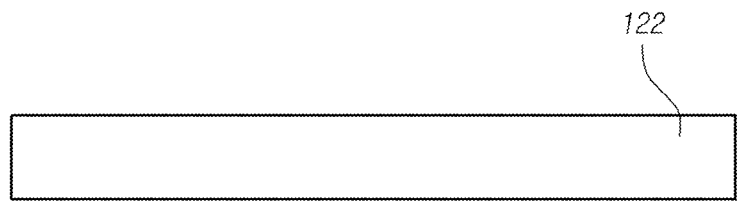
FIGS. 4A to 4F illustrate a process of manufacturing a multi-layer substrate having a structure of FIGS. 2 and 3.
Figure 4B:
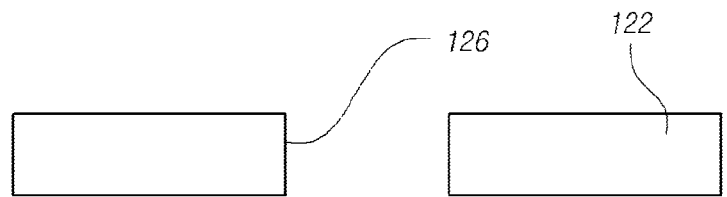

Firstly, as illustrated in FIG. 4A, the first substrate base 122 is mechanically or chemically punched, and as illustrated in FIG. 4B, the first through-hole 126, in which the first waveguide 320 is to be formed, is formed.

At this time, the first substrate base 122 may be a substrate which is made of a dielectric substance having a permittivity of 2.0 to 2.5 and has a thickness of about 3-8 millimeters, but is not limited thereto, and may include a general PCB.

Meanwhile, the first through-hole 126 formed in the first substrate base 122 has a shape of a rectangle or a square, and the size thereof may be determined by an operating frequency range of a wireless signal transmission/reception apparatus in which a multi-layer substrate is to be used.

That is, when an operating frequency of a wireless signal transmission/reception apparatus (e.g., a radar) in which the multi-layer substrate according to the present invention is used is 24 GHz, the size of the through-hole or the first and second waveguides may be about 10-11 mm in a horizontal direction and about 4-5 mm in a vertical direction. More preferably, when an operating frequency is 24 GHz, the size of the through-hole or the first and second waveguides may be about 10.7 mm in a horizontal direction and about 4.3 mm in a vertical direction, and a cut-off frequency may be about 14.058 GHz.

Further, when an operating frequency of a wireless signal transmission/reception apparatus (e.g., a radar) in which the multi-layer substrate according to the present invention is used is 77 GHz, the size of the through-hole or the first and second waveguides may be about 2.5-3.5 mm in a horizontal direction and about 1.2-1.6 mm in a vertical direction.

More precisely, when an operating frequency is 77 GHz, the size of the through-hole or the first and second waveguides is about 3.1 mm in a horizontal direction and about 1.5 mm in a vertical direction, and a cut-off frequency is about 48.387 GHz. Otherwise, the size of the through-hole or the first and second waveguide is about 2.54 mm in a horizontal direction and about 1.27 mm in a vertical direction, and a cut-off frequency is about 59.055 GHz.

Figure 4C:
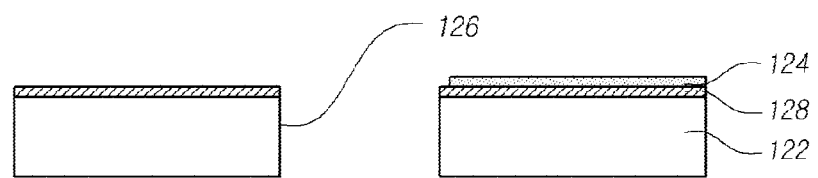

Next, as illustrated in FIG. 4C, the upper circuit pattern 128 and the first signal line 124 are formed on the first substrate base 122.

Of course, it is not necessary to form the first signal line and the upper circuit pattern after the first through-hole 126 is formed as above, and in some cases, the first through-hole 126 may be formed after the upper circuit pattern 128 and the first signal line 124 are firstly formed.

The upper circuit pattern 128 and the first signal line 124 can be manufactured by depositing a metal thin film having a predetermined thickness on the first substrate base 122 and then performing patterning with a predetermined pattern.

In the patterning, after a photo-resistor, which is a light sensitive material, is applied, a light exposure operation and a developing operation are performed using a mask, and the photo-resistor remains selectively.

In this state, an etching process is performed in a predetermined area, and whereby the process proceeds to a so-called "photo-resistor process" which leaves a predetermined pattern, but the present invention is not limited thereto.

Figure 4D:
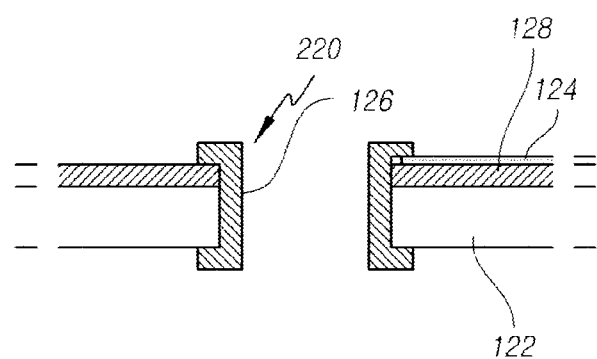

Next, as illustrated in FIG. 4D, the first conductive film 220 is formed by depositing an electro-conductive material on the inner surface of the first through-hole 126.

In more detail, the first conductive film 220 is formed to become a U-shaped metal layer. That is, the first conductive film 220 may include the first side conductive layer 220 formed on the side surface of the first through-hole 126, the first upper flange conduction layer 224 which is connected to the first side surface conductive layer 222 and curvedly extends toward a part of the upper side of the first substrate base 122, and the first lower flange conductive layer 226 which is connected to the first side conductive layer and curvedly extends toward a part of the lower side of the first substrate base 122.

In this way, in a state in which the first conductive film 220 is formed, a part of the first conductive film 220, i.e., the first upper flange conduction layer 224 of the first conductive film 220 is electrically connected to the first signal line 124.

The first through-hole 126 and the first conductive film 220 enclosing the same constitute the first waveguide 320 which is a transmission path of an RF signal in the upper substrate.

Through the aforementioned process, the upper substrate 120 is completely manufactured.

Further, although not separately illustrated, the lower substrate 130 can also be manufactured using the same scheme in FIGS. 4A to 4D, which is the process of manufacturing the upper substrate.

After the upper substrate 120 and the lower substrate 130 are completely manufactured, the two substrates are coupled to each other.

Figure 4E:
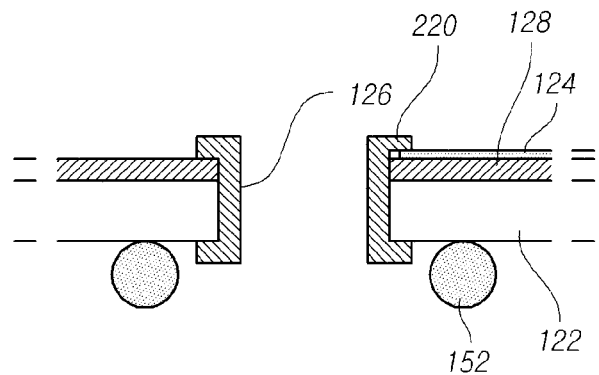

That is, as illustrated in FIG. 4E, the soldering balls 152 are formed on a surface (i.e., the coupling surface of the upper substrate) opposite to a surface which belongs to the upper substrate 120 and on which the upper circuit pattern 128 and the first signal line 124 are formed.

In a process of forming the soldering ball 152, a mask for forming the coupling layer is arranged on the coupling surface of the upper substrate, a specific metal material is applied to the coupling surface of the upper substrate, the metal material passes only through a perforated part of the mask, and thus, a plurality of soldering balls having a predetermined pattern can be formed.

Figure 4F:
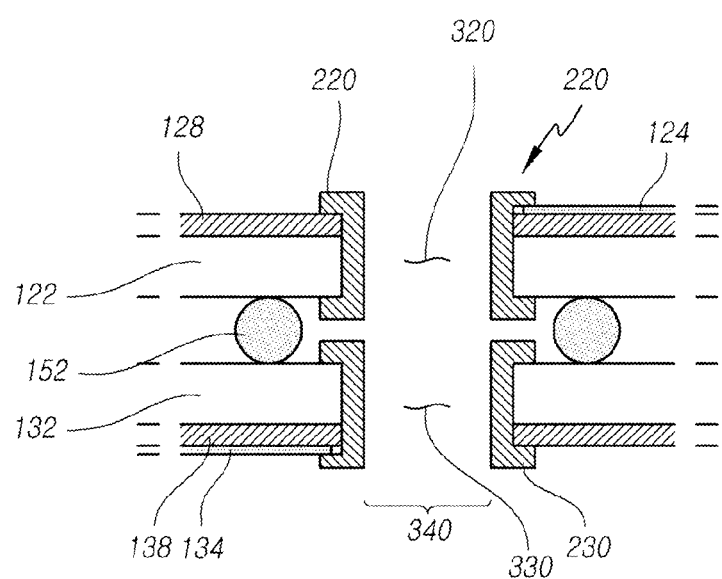

Next, as illustrated in FIG. 4F, in a state in which the lower substrate is disposed below the upper substrate, the two substrates are bonded or coupled to each other using the soldering balls.

In FIG. 4F, the two substrates are arranged and a constant amount of heat is applied to melt the soldering balls using an alignment mark, etc., formed on the two substrates in a state in which the two substrates are arranged, so that the two substrates are bonded to each other.

All technologies, which belong to the SMT and can be used to precisely laminate the multi-layer substrate, can be applied as such a substrate arrangement and bonding process.

According to the aforementioned process, the first waveguide 320 formed on the upper substrate and the second waveguide 330 formed on the lower substrate are easily arranged so that the precise entire waveguide 340 can be formed.

Figure 1A:
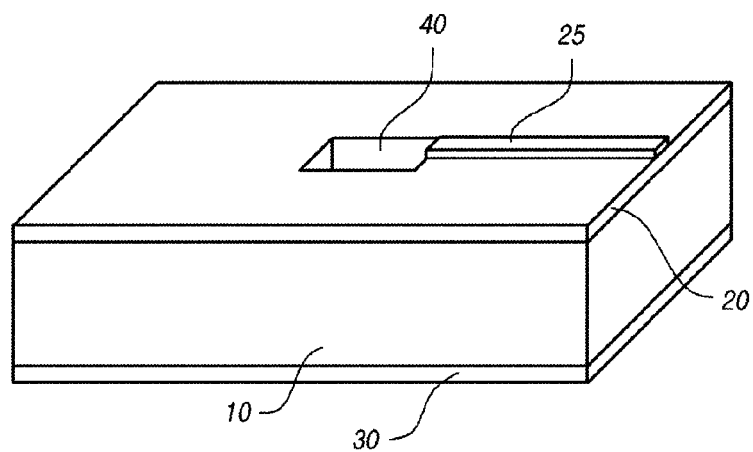

As compared to the scheme of FIG. 1 in which the upper/lower PCBs and the intermediate plate, which are separately manufactured, are assembled, in the embodiment of the present invention in which the process of manufacturing a multi-layer substrate by the SMT is used, since the upper substrate and the lower substrate can be easily arranged, the waveguide, which passes through the multi-layer substrate, can be precisely and easily formed.

Further, according to an embodiment of the present invention, the through-holes are formed in the upper/lower substrates, respectively, and the first waveguide and the second waveguide are formed by enclosing parts near the through-holes by the conductive films, and then the two substrates are bonded to each other using the soldering member such as the soldering ball, so that the multi-layer substrate is easily manufactured and the waveguides can be precisely formed.

Further, as illustrated in FIG. 1B, in the multi-layer substrate formed using the upper/lower PCBs and the intermediate plate, only an RF signal can be transmitted through the waveguide. However, according to the present invention, a low frequency signal having a predetermined frequency or less and a general electric signal as well as the RF signal can be transmitted between the two substrates.

Further, the multi-layer substrate of FIG. 1 can be applied only to a case where the upper/lower PCBs have the same size. However, the multi-layer substrate according to the present invention can be applied to a case where the upper substrate and the lower substrate have different sizes, so that flexibility of a circuit design can be improved.

Figure 5A:
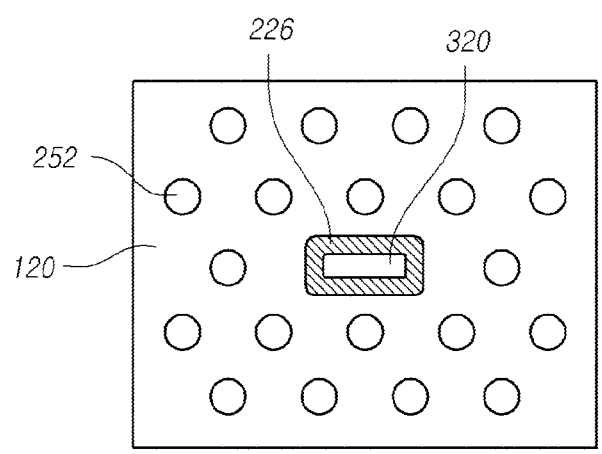
FIG. 5A is a plan view illustrating a coupling surface of an upper substrate in a multi-layer substrate according to another embodiment of the present invention.
Figure 5B:
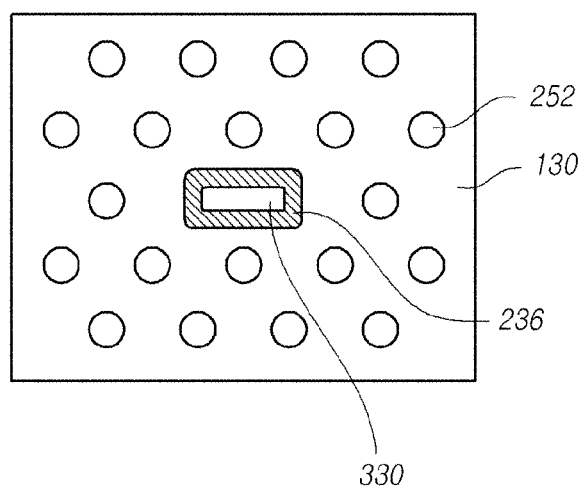
FIG. 5B is a plan view illustrating a coupling surface of a lower substrate.

FIG. 5A is a plan view illustrating a coupling surface of an upper substrate in a multi-layer substrate according to another embodiment of the present invention, and FIG. 5B is a plan view illustrating a coupling surface of a lower substrate.

In an embodiment illustrated in FIG. 5, the form of soldering balls 252 by which the upper substrate and the lower substrate are coupled to each other is similar to the embodiment of FIG. 3, but there is a difference in that arrangement of the soldering balls 252 corresponds to not a chessboard but a triangle.

That is, in an embodiment of FIG. 3, the soldering balls 152 are arranged in a form of a square lattice. However, in an embodiment of FIG. 5, the soldering balls 252 are arranged in a form of parallelogram or a triangle.

In an embodiment of FIG. 5, a process of arranging the soldering balls 252 may be inconvenient, but, as compared to the embodiment of FIG. 3, coupling force proportional to the number of the soldering balls 252 can be ensured to be large.

Figure 6A:
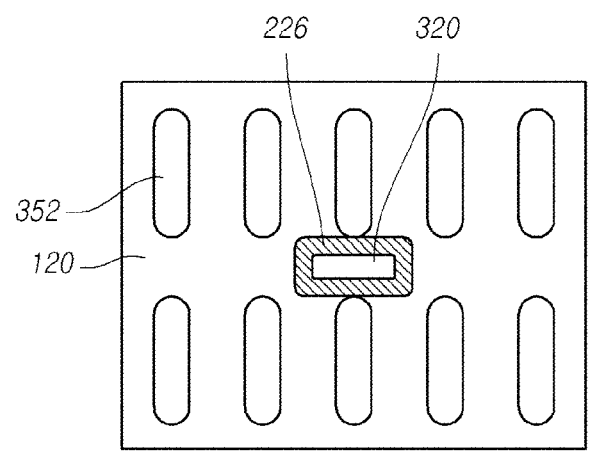
FIG. 6A is a plan view illustrating a coupling surface of an upper substrate in a multi-layer substrate according to yet another embodiment of the present invention.
Figure 6B:
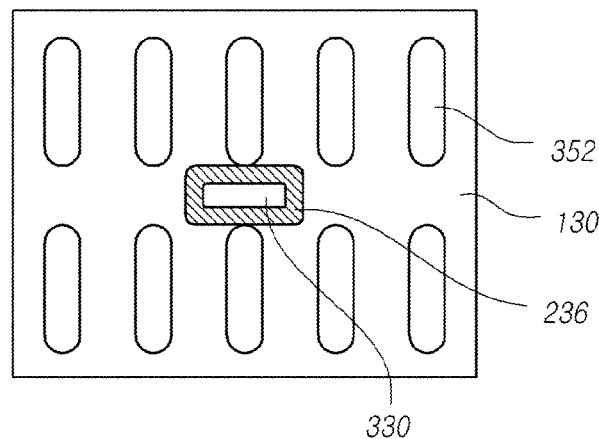
FIG. 6B is a plan view illustrating a coupling surface of a lower substrate.

FIG. 6A is a plan view illustrating a coupling surface of an upper substrate in a multi-layer substrate according to yet another embodiment of the present invention, and FIG. 6B is a plan view illustrating a coupling surface of a lower substrate.

In the multi-layer substrate according to an embodiment illustrated in FIG. 6, not a soldering ball but a soldering extension member 352 having a rectangular shape and extending lengthwise is employed as a soldering member of a coupling layer by which the upper substrate and the lower substrate are coupled to each other.

That is, a plurality of extension members 352, which extend lengthwise and linearly, are formed on a coupling surface of the upper substrate, and the lower substrate is bonded using the soldering extension members 352.

As illustrated in FIG. 6, as compared to the embodiments of FIGS. 3 to 5 in which the soldering balls are used, when the rectangular soldering extension members 352 are used, raw materials of the soldering members are more greatly consumed, but a strong coupling force between the upper/lower substrates is ensured.

Figure 7A:
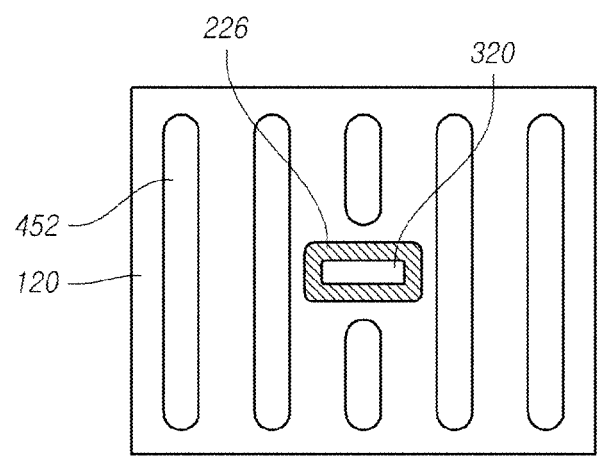
FIG. 7A is a plan view illustrating a coupling surface of an upper substrate in a multi-layer substrate according to yet another embodiment of the present invention.
Figure 7B:
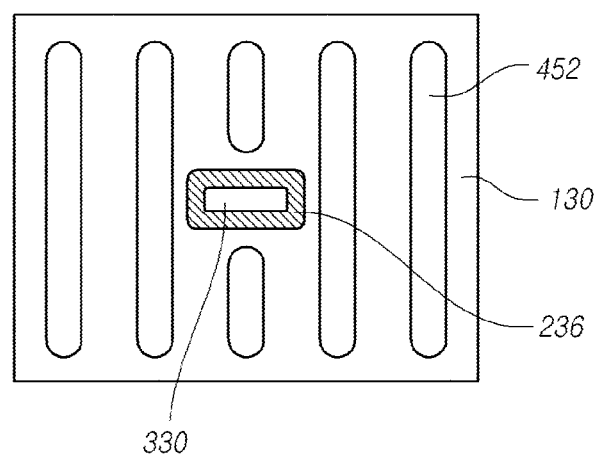
FIG. 7B is a plan view illustrating a coupling surface of a lower substrate.

FIG. 7A is a plan view illustrating a coupling surface of an upper substrate in a multi-layer substrate according to yet another embodiment of the present invention, and FIG. 7B is a plan view illustrating a coupling surface of a lower substrate.

The multi-layer substrate according to the embodiment illustrated in FIG. 7 is different from the other embodiments in that the soldering member by which the upper substrate and the lower substrate are coupled to each other is not the soldering balls but a rectilinear soldering groove 452.

There is a difference in that the soldering extension members 352 of FIG. 6 extend in the lengthwise direction by a predetermined amount but the soldering grooves 452 of FIG. 7 are soldering members extending in a horizontal direction or in a vertical direction of the coupling surface.

As illustrated in FIG. 7, in a case of the soldering grooves 452 formed in the lengthwise direction of the coupling surface of the substrate, as compared to the soldering balls of FIGS. 3 to 5 and the soldering extension members 352 of FIG. 6, raw materials of the soldering members are more greatly used, but a very strong substrate coupling force can be ensured.

As above, according to the present invention, the process of manufacturing the multi-layer substrate using the SMT is used. According to such a process, since the upper substrate and the lower substrate are easily arranged, the waveguide, which passes through the multi-layer substrate, can be precisely and easily formed.

Further, the through-holes are formed in the upper/lower substrates, respectively, and the first waveguide and the second waveguide are formed by enclosing parts near the through-holes by the conductive films, and then the both substrates are bonded to each other using the soldering member such as the soldering ball, so that the multi-layer substrate is easily manufactured and the waveguides can be precisely formed.

Further, in the multi-layer substrate according to the present invention, a low frequency signal having a predetermined frequency or less and a general electrical signal as well as an RF signal can be transmitted between the two substrates, and the multi-layer substrate can be applied to a case where the upper substrate and the lower substrate have different sizes. Therefore, flexibility of circuit design can be improved.

The description and the attached drawings are provided only to exemplarily describe the technical spirit of the present invention, and it will be appreciated by those skilled in the art to which the present invention pertains that the present invention may be variously corrected and modified, for example, by coupling, separating, replacing, and changing the elements. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

[DESCRIPTION OF REFERENCE NUMERALS]

| | |
|---|---|
| 120: Upper substrate | 122: First substrate base |
| 124: First signal line | 126: First through-hole |
| 128: Upper circuit pattern | 130: Lower substrate |
| 132: Second substrate base | 134: Second signal line |
| 136: Second through-hole | 138: Lower circuit pattern |
| 150: Coupling layer | 152: Soldering ball |
| 220: First conductive film | |
| 230: Second conductive film | |

What is claimed is:

1. A multi-layer substrate comprising:
   an upper substrate comprising:
      a first substrate base;
      a first signal line formed on the first substrate base; and
      a first waveguide which is connected to the first signal line,
      wherein the first waveguide comprises a first conductive film formed on an inner surface of a first through-hole passing through the first substrate base in a thickness direction;
   a lower substrate comprising:
      a second base substrate;
      a second signal line formed on the second substrate base; and
      a second waveguide which is connected to the second signal line,
      wherein the second waveguide comprises a second conductive film formed on an inner surface of a second through-hole passing through the second substrate base in a thickness direction; and
   a coupling layer for coupling the upper substrate and the lower substrate to each other,
   wherein a Radio Frequency (RF) signal is transmitted between the upper substrate and the lower substrate through the first waveguide and the second waveguide,
   wherein the coupling layer comprises a plurality of soldering members arranged between a lower surface of the first substrate base and an upper surface of the second substrate base,
   wherein the soldering members include soldering extension members or soldering grooves extending lengthwise, and
   wherein, when the multi-layer substrate is used for a circuit having an operating frequency of 77 GHz, the sizes of the first waveguide and the second waveguide are 2.5-3.5 mm in a horizontal direction and 1.2-1.6 mm in a vertical direction, and, when the multi-layer substrate is used for a circuit having an operating frequency of 24 GHz, the sizes of the first waveguide and the second waveguide are 10-11 mm in a horizontal direction and 4-5 mm in a vertical direction.

2. The multi-layer substrate of claim 1, wherein the first conductive film comprises a first side conductive layer formed on a side surface of the first through-hole, a first upper flange conductive layer extending toward a part of an upper side of the first substrate base integrally with the first side conductive layer, and a first lower flange conductive layer extending toward a part of a lower side of the first substrate base integrally with the first side conductive layer.

3. The multi-layer substrate of claim 2, wherein the first upper flange conductive layer is formed to overlap one end of the first signal line so as to be electrically connected to the first signal line.

4. The multi-layer substrate of claim 1, wherein the sizes of the first waveguide and the second waveguide are 3.1 mm (horizontal)×1.5 mm (vertical) or 2.54 mm (horizontal)×1.27 mm (vertical).

* * * * *